United States Patent [19]
Sone

[11] Patent Number: 5,583,459
[45] Date of Patent: Dec. 10, 1996

[54] SAMPLE HOLD CIRCUIT

[75] Inventor: Kazuya Sone, Tokyo, Japan

[73] Assignee: NEC Corporation, Tokyo, Japan

[21] Appl. No.: 500,356

[22] Filed: Jul. 10, 1995

[30]  Foreign Application Priority Data

Jul. 8, 1994 [JP] Japan .................................. 6-156318

[51] Int. Cl.$^6$ ............................................. G11C 27/02
[52] U.S. Cl. ................... 327/95; 327/96; 327/314; 327/323; 327/563
[58] Field of Search ........................... 327/91, 94, 95, 327/96, 97, 491, 310, 312, 314, 320, 323, 325, 563, 561

[56]  References Cited

U.S. PATENT DOCUMENTS

| | | | |
|---|---|---|---|
| 3,701,909 | 10/1972 | Holmes et al. ................. | 327/95 |
| 3,838,346 | 9/1974 | Cox ................................ | 327/95 |
| 4,612,464 | 9/1986 | Ishikawa et al. ................ | 327/94 |
| 4,716,305 | 12/1987 | Sakuragi et al. ................ | 327/491 |
| 4,806,790 | 2/1989 | Sone ................................ | 307/353 |
| 4,958,094 | 9/1990 | Ishii et al. ...................... | 327/491 |
| 5,130,572 | 7/1992 | Stitt et al. ...................... | 327/96 |

OTHER PUBLICATIONS

Patent Abstracts of Japan, vol. 16, No. 113 (P-1327), 19 Mar. 1992, JP 3-283195.
Patent Abstracts of Japan, vol. 14, No. 258 (P-1055), 4 Jun. 1990, JP 2-068800.
Patent Abstracts of Japan, vol. 13, No. 403 (P-929), 7 Sep. 1989, JP 1-144299.
Patent Abstracts of Japan, vol. 18, No. 353 (P-1764), 4 Jul. 1994, JP 6-089594.

*Primary Examiner*—Timothy P. Callahan
*Assistant Examiner*—My-Trang Nu Ton
*Attorney, Agent, or Firm*—Foley & Lardner

[57]  ABSTRACT

A sample hold circuit comprises a first transistor having its base connected to an input terminal and its collector connected to a voltage supply terminal, series-connected first and second diodes having a cathode of the first diode connected to an emitter of the first transistor, a first constant current source having its one end connected to an anode of the second diode circuit and its other end connected to the voltage supply terminal, a first differential circuit including a first branch connected to the emitter of the first transistor and a second branch connected to the anode of the second diode, a third diode having its cathode connected to the anode of the second diode, a second transistor having its base connected to a connection node between the second diode and the third diode and its collector connected to the voltage supply terminal, a second differential circuit including a first branch connected to the voltage supply terminal and a second branch connected to an emitter of the second transistor, a hold capacitor having its one end connected to the emitter of the second transistor, and a buffer having its input connected to the hold capacitor and its output connected to an output terminal and an anode of the third diode.

9 Claims, 8 Drawing Sheets

SAMPLE HOLD CIRCUIT

BACKGROUND OF THE INVENTION

1. Field of the Invention

The present invention relates to a sample hold circuit for sampling and holding an instantaneous value of an analog signal, and more specifically to a sample hold circuit which is suitable to an integrated circuit and which can sample and hold a high speed analog signal.

2. Description of Related Art

One typical example of this type sample hold circuit is disclosed in, for example, U.S. Pat. No. 4,806,790.

Referring to FIG. 1, there is shown a conventional sample hold circuit shown in FIG. 2 of U.S. Pat. No. 4,806,790. The shown sample hold circuit includes a transistor Q11 having its base connected to an input terminal 11 and its collector connected to a high voltage supply terminal 15, series-connected diodes (D11 to D13) having its cathode side connected to an emitter of the transistor Q11, a constant current source I14 having its one end connected to an anode of the diode D13 and its other end connected to the high voltage supply terminal 15, and a differential circuit 31 including a differential pair of composed of one transistor Q14 having its collector connected to the emitter of the transistor Q11 and another transistor Q15 having its collector connected to the anode of the diode D13, and a constant current source I11. The shown circuit also comprises a diode D14 having its cathode connected to the anode of the diode D13, and its anode connected to a bias voltage terminal 17, a transistor Q12 having its base connected to a connection node between the diodes D13 and D14 and its collector connected to the high voltage supply terminal 15, and a differential circuit 32 including a differential pair of composed of one transistor Q16 having its collector connected to the high voltage supply terminal 15 and another transistor Q17 having its collector connected to an emitter of the transistor Q12, and a constant current source I12. Furthermore, the shown circuit comprises a hold capacitor $C_H$ having its one end connected to the emitter of the transistor Q12 and its other end connected to ground, and an emitter follower 33 composed of a transistor Q13 having its base connected to the hold capacitor $C_H$ and its emitter connected to an output terminal 12 and a constant current source I13.

Now, operation of this conventional sample hold circuit will be described.

In a sample mode in which an input voltage Sin on a control input terminal 13 is at a high level ("H") and an input voltage Hin on a complementary control input terminal 14 is a low level ("L"), the transistors Q14 and Q17 of the differential transistor pairs (Q14 and Q15) and (Q16 and Q17) are rendered conductive, and the transistors Q15 and Q16 are rendered non-conductive.

At this time, the analog signal Vin on the input terminal 11 is applied to the base of the transistor Q11, so that the transistor Q11 operates as an emitter follower. The series-connected diodes (D11 to D13) connected to the emitter of the transistor Q11, acts as a level shift circuit supplied with a current from the constant current source I14 Incidentally, a current of the constant current source I11 is a sum of the current of the constant current source I14 and an operating current of the transistor Q11. The transistor Q12 operates as an emitter follower, so that the hold capacitor $C_H$ is charged or discharged. The transistor Q13 receiving the voltage of the hold capacitor $C_H$ as an input, operates as an emitter follower, so that an output voltage Vo is outputted from the output terminal 12.

Now, assuming that a base-emitter voltage of the transistor Q11 is $V_{BE11}$, a base-emitter voltage of the transistor Q12 is $V_{BE12}$, a base-emitter voltage of the transistor Q13 is $V_{BE13}$, and a forward direction voltage drop $V_{F11}$ of the diode D11, a forward direction voltage drop $V_{F12}$ of the diode D12, and a forward direction voltage drop $V_{F13}$ of the diode D13, are the same voltage "$V_D$", the output voltage Vo can be expressed as follows:

$$Vo = Vin - (V_{BE11} + V_{BE12} + V_{BE13}) + 3V_D$$

Here, if it is set that all current densities of the transistors Q11, Q12 and Q13 and the diodes D11, D12 and D13 are equal, the following equation holds:

$$V_{BE11} + V_{BE12} + V_{BE13} \approx 3V_D$$

In this case, therefore, the relation becomes Vo=Vin, and accordingly, the output voltage Vo follows the input voltage Vin.

In a hold mode in which the input voltage Sin and the input voltage Hin are brought to the low level ("L") and the high level ("H"), respectively, the transistors Q14 and Q17 are rendered off, and the transistors Q15 and Q16 are rendered on. In this condition, the transistor Q12 which had operated in the emitter follower fashion in the sample mode so as to cause to charge or discharge the hold capacitor $C_H$, is rendered non-conductive as a result of the conducting of the diode D14, so that the charge/discharge operation is stopped and an instantaneous value of the voltage Vin+$V_D$ is held in the hold capacitor $C_H$.

Thus, an instantaneous value of the input voltage Vin is held and outputted from the output terminal 12. Incidentally, a condition of cutting off the transistor Q12 is sufficient if a sum of the potential of the hold capacitor $C_H$ and the base-emitter voltage $V_{BE12}$ of the transistor Q12, namely, the base potential (Vin+2$V_D$) of the transistor Q12 is larger than a voltage obtained by subtracting the forward direction voltage drop $V_{F14}$ of the diode D14 from the voltage of the bias voltage terminal 17. Here, assuming that the voltage of the bias voltage terminal 17 is $V_B$, and the forward direction voltage drop $V_{F14}$ of the diode D14 is equal to $V_D$, the above condition can be expressed as $$V_B - V_D < Vin + 2V_D$$

As one example, assuming that the analog input voltage Vin takes a value in the range of −2 V to 0 C, since $V_D$ is generally on the order of 0.7 V to 0.8 V, it is sufficient if the bias voltage $V_B$ is on the order of 0 V (ground potential). On the other hand, the above condition can be satisfied by connecting the terminal 17 in common to the high voltage supply terminal 15, and replacing the diode D14 by a plurality of diodes.

However, the above mentioned sample hold circuit is disadvantageous in that the condition for holding the input voltage depends upon the input voltage, and a non-linear characteristics of the circuit becomes large.

In other words, the cut-off condition "$V_B - V_D < Vin + 2V_D$" of the emitter follower transistors Q12 can be modified as follows:

$$V_B - 3V_D < Vin$$

Accordingly, it is disadvantageous in that the range of the input voltage that can be held in the sample hold circuit, is limited, and the cut-off condition of the transistors Q12 depends upon the input voltage.

SUMMARY OF THE INVENTION

Accordingly, it is an object of the present invention to provide a sample hold circuit which has overcome the above mentioned defect of the conventional one.

Another object of the present invention is to provide a sample hold circuit so configured that the range of the input voltage is not limited by the condition for holding the input voltage, so that even if the voltage supply voltage is small, a wide operational range can be obtained.

Still another object of the present invention is to provide a sample hold circuit so configured that when an input voltage is held, a cutoff transistor is always fixed to a constant operation condition, so that the cutoff condition become constant and therefore, a factor causing the non-linearity can be eliminated.

The above and other objects of the present invention are achieved in accordance with the present invention by a sample hold circuit comprising:

- a first transistor having its base connected to an input terminal and its collector connected to a voltage supply terminal;
- a diode circuit having its cathode side connected to an emitter of the first transistor;
- a first constant current source having its one end connected to an anode side of the diode circuit and its other end connected to the voltage supply terminal;
- a first differential circuit including one transistor having its collector connected to the emitter of the first transistor and its base connected to a first control input and another transistor having its collector connected to the anode side of the diode circuit and its base connected to a second control input complementary to the first control input, and a constant current source having its one end connected in common to emitters of the one transistor and the another transistor;
- a second diode circuit having its cathode side connected to the anode side of the first diode circuit;
- a second transistor having its base connected to a connection node between the first diode circuit and the second diode circuit and its collector connected to the voltage supply terminal;
- a second differential circuit one transistor having its collector connected to the voltage supply terminal and its base connected to the second control input and another transistor having its collector connected to an emitter of the second transistor and its base connected to the first control input, and a constant current source having its one end connected in common to emitters of the one transistor and the another transistor of the second differential circuit;
- a hold capacitor having its one end connected to the emitter of the second transistor; and
- a buffer having its input connected to the hold capacitor and its output connected to an output terminal and an anode side of the second diode circuit.

In an embodiment, each of said first and second diode circuits can be composed of a single diode, a plurality of diodes series-connected in the same direction, a single transistor connected in the form of a diode, or a plurality of transistors which are series-connected in the same direction and each of which is connected in the form of a diode.

In one embodiment, the buffer includes an operational amplifier having its non-inverting input connected to the hold capacitor and its output connected to the output terminal and the anode side of the second diode circuit, the output of the operational amplifier being connected to an inverting input of the operational amplifier itself so that a closed loop full feedback is constituted.

In another embodiment, the buffer is constituted of an emitter follower. Alternatively, the buffer is constituted of a source follower.

According to another aspect of the present invention, there is provided a sample hold circuit comprising:

- a first transistor having its base connected to an input terminal and its collector connected to a voltage supply terminal;
- a diode circuit having its cathode side connected to an emitter of the first transistor;
- a first constant current source having its one end connected to an anode side of the diode circuit and its other end connected to the voltage supply terminal;
- a first differential circuit one transistor having its collector connected to the emitter of the first transistor and its base connected to a first control input and another transistor having its collector connected to the anode side of the diode circuit and its base connected to a second control input complementary to the first control input, and a constant current source having its one end connected in common to emitters of the one transistor and the another transistor;
- a second diode circuit having its cathode side connected to the anode side of the first diode circuit;
- a second transistor having its base connected to a connection node between the first diode circuit and the second diode circuit and its collector connected to the voltage supply terminal;
- a second differential circuit including one transistor having its collector connected to the voltage supply terminal and its base connected to the second control input and another transistor having its collector connected to an emitter of the second transistor and its base connected to the first control input, and a constant current source having its one end connected in common to emitters of the one transistor and the another transistor of the second differential circuit;
- a hold capacitor having its one end connected to the emitter of the second transistor; and
- a buffer having its input connected to the hold capacitor, its first output connected to an anode side of the second diode circuit, and its second output connected to an output terminal.

In an embodiment, each of said first and second diode circuits can be composed of a single diode, a plurality of diodes series-connected in the same direction, a single transistor connected in the form of a diode, or a plurality of transistors which are series-connected in the same direction and each of which is connected in the form of a diode.

In one embodiment, the buffer includes an emitter follower and a source follower, an output of the source follower being connected to the anode side of the second diode circuit, an output of the emitter follower being connected to the output terminal.

In another embodiment, the buffer includes two emitter followers, an output of one of the two emitter followers being connected to the anode side of the second diode circuit, an output of the other of the two emitter followers being connected to the output terminal.

Alternatively, the buffer includes two source followers, an output of one of the two source followers being connected to the anode side of the second diode circuit, an output of the other of the two source followers being connected to the output terminal.

DESCRIPTION OF THE PREFERRED EMBODIMENTS

Figure 1:
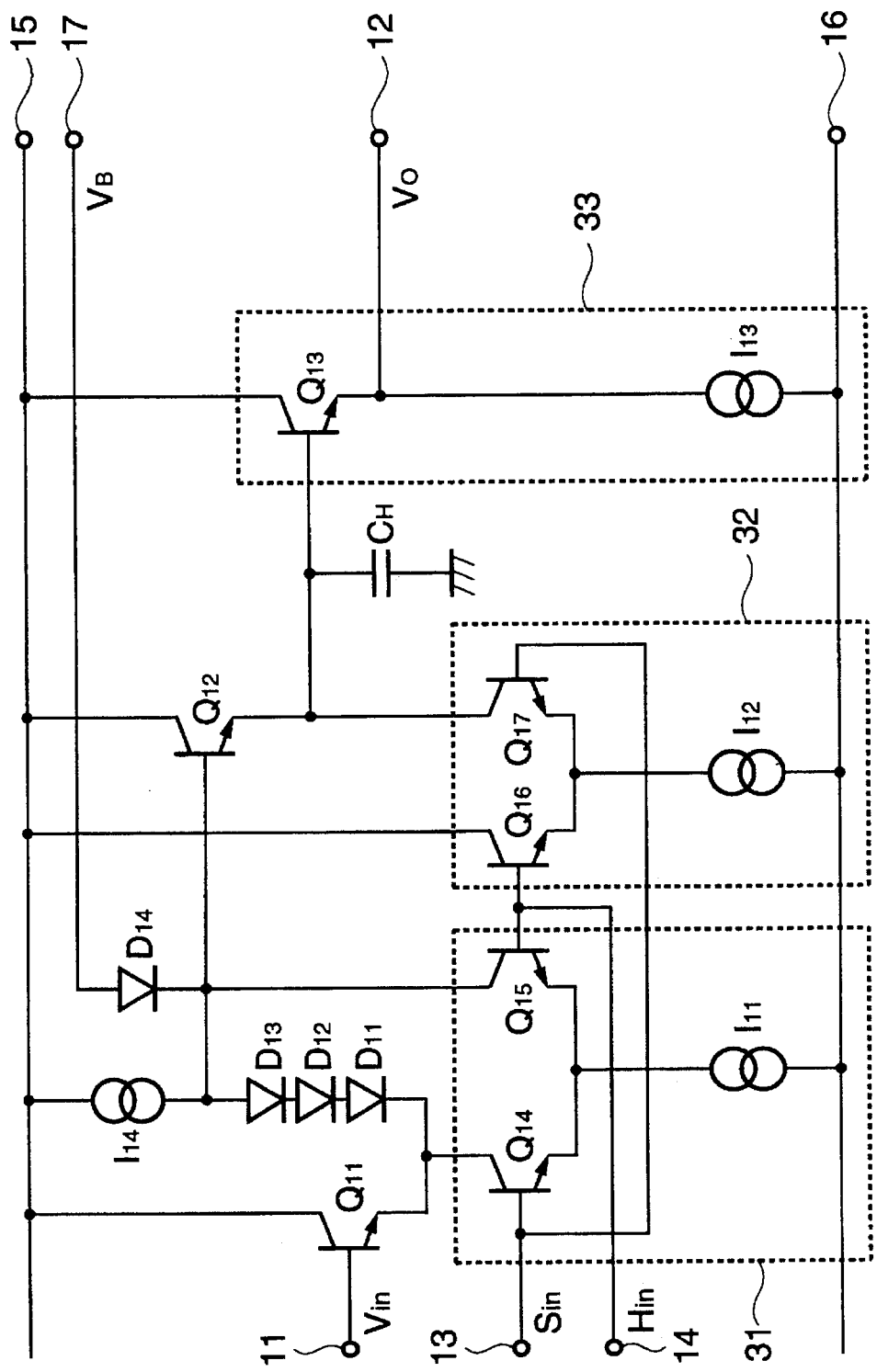
FIG. 1 is a circuit diagram of a conventional sample hold circuit.
Figure 2:
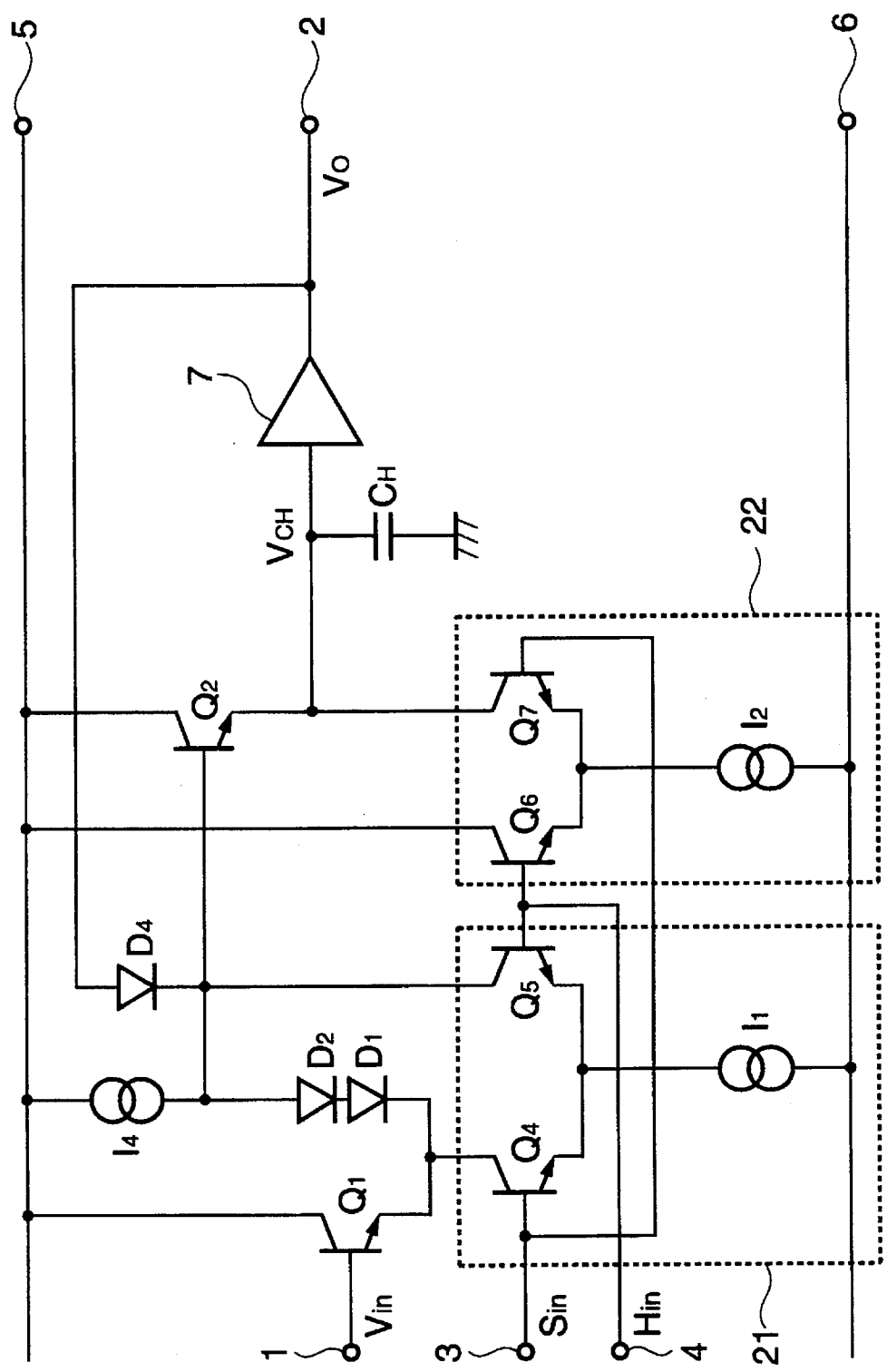
FIG. 2 is a circuit diagram of a first embodiment of the sample hold circuit in accordance with the present invention.

Referring to FIG. 2, there is shown a circuit diagram of a first embodiment of the sample hold circuit in accordance with the present invention.

As shown in FIG. 2, the first embodiment of the sample hold circuit in accordance with the present invention includes a transistor Q1 having its base connected to an input terminal 1 and its collector connected to a high voltage supply terminal 5, a pair of series-connected diodes D1 and D2 having its cathode of the diode D1 connected to an emitter of the transistor Q1, a constant current source I4 having its one end connected to an anode of the diode D2 and its other end connected to the high voltage supply terminal 5, and a differential circuit 21 including a differential pair composed of a pair of transistors Q4 and Q5 and a constant current source I1 having its one end connected in common to emitters of the transistors Q4 and Q5 and its other end connected to a low voltage supply terminal 6. The transistor Q4 has its collector connected to the emitter of the transistor Q1 and its base connected to a sample control input terminal 3, and the transistor Q5 has its collector connected to the anode of the diode D2 and its base connected to a hold control input terminal 4.

The shown circuit also comprises a diode D4 having its cathode connected to the anode of the diode D2, a transistor Q2 having its base connected to a connection node between the diodes D2 and D4 and its collector connected to the high voltage supply terminal 5, and a differential circuit 22 including a differential pair composed of a pair of transistors Q6 and Q7 and a constant current source I2 having its one end connected in common to emitters of the transistors Q6 and Q7 and its other end connected to the low voltage supply terminal 6. The transistor Q6 has its collector connected to the high voltage supply terminal 5 and its base connected to the hold control input terminal 4, and the transistor Q7 has its collector connected to an emitter of the transistor Q2 and its base connected to the sample control input terminal 3.

Furthermore, the shown circuit comprises a hold capacitor $C_H$ having its one end connected to the emitter of the transistor Q2 and its other end connected to ground, and a buffer 7 having its input connected to the hold capacitor $C_H$ and its output connected to an output terminal 2 and an anode of the diode D4.

Now, operation of this first embodiment of the sample hold circuit will be described.

In a sample mode in which an input voltage Sin on the sample control input terminal 3 is at a high level ("H") and an input voltage Hin on the hold control input terminal 4 complementary to the sample control input terminal 3 is a low level ("L"), the transistors Q4 and Q7 of the differential transistor pairs (Q4 and Q5) and (Q6 and Q7) are rendered conductive, and the transistors Q5 and Q6 are rendered non-conductive.

At this time, the analog signal Vin on the input terminal 1 is applied to the base of the transistor Q1, so that the transistor Q1 operates as an emitter follower. The series-connected diodes D1 and D2 connected to the emitter of the transistor Q1, acts as a level shift circuit supplied with a current from the constant current source I4 Incidentally, a current of the constant current source I1 is a sum of the current of the constant current source I4 and an operating current of the transistor Q1. The transistor Q2 operates as an emitter follower, so that the hold capacitor $C_H$ is charged or discharged. The buffer 7 receives a voltage $V_{CH}$ on the hold capacitor $C_H$ as an input, and amplifies the received voltage with a gain of 1 (one), so that an output voltage Vo is outputted from the output terminal 2.

Here, by using a DC level shift voltage $V_{LS}$ of the buffer 7, the output voltage Vo can be expressed:

$$V_O = V_{CH} - V_{LS}$$

Now, assuming that a base-emitter voltage of the transistor Q1 is $V_{BE1}$ and a base-emitter voltage of the transistor Q2 is $V_{BE2}$ and a forward direction voltage drop $V_{F1}$ of the diode D1 and a forward direction voltage drop $V_{F2}$ of the diode D2 are the same voltage "$V_D$", the voltage $V_{CH}$ on the hold capacitor $C_H$ can be expressed as follows:

$$V_{CH} = V_{in} - (V_{BE1} + V_{BE2}) + 2V_D$$

Here, if it is set that all current densities of the transistors Q1 and Q2 and and the diodes D1 and D2 are equal, the following equation holds:

$$V_{BE1} + V_{BE2} = 2V_D$$

In this case, therefore, the relation becomes $V_{CH} = V_{in}$, and accordingly, the voltage $V_{CH}$ on the hold capacitor $C_H$ follows the input voltage Vin.

In a hold mode in which the input voltage Sin and the input voltage Hin are brought to the low level ("L") and the high level ("H"), respectively, the transistors Q4 and Q7 are rendered off, and the transistors Q5 and Q6 are rendered conductive.

In this condition, the transistor Q2 which had operated in the emitter follower fashion in the sample mode so as to cause to charge or discharge the hold capacitor $C_H$, is rendered non-conductive as a result of the conducting of the diode D4, so that the charge/discharge operation is stopped and an instantaneous value of the analog input voltage Vin is held in the hold capacitor $C_H$. In the buffer 7, the instantaneous value of the analog input voltage Vin is level-shifted by the voltage $V_{LS}$, so that the output expressed by the following equation is outputted:

$$V_O = V_{in} - V_{LS}$$

Here, assuming that the forward direction voltage drop $V_{F4}$ of the diode D4 is equal to $V_D$, the base potential of the transistor Q2 can be expressed as $$V_O - V_D = V_{in} - V_{LS} - V_D$$

The emitter voltage of the transistor Q2 is the voltage of the hold capacitor $C_H$, and therefore, it is equal to the analog input voltage Vin. Namely, the base-emitter voltage $V_{BE2}$ of the transistor Q2 can be expressed as follows:

$$V_{BE2} = -\{V_{LS} + V_D\}$$

Accordingly, the base-emitter of the transistor Q2 is applied with a constant reverse-bias voltage of $\{V_{LS}+V_D\}$.

Thus, the sample hold circuit of the first embodiment of the present invention is so configured that, the transistor Q2 can take a cutoff condition without subjecting to restriction of the range of the analog input voltage Vin, and the cutoff voltage is the reverse-bias voltage of $\{V_{LS}+V_D\}$, which is always at a constant. Therefore, the non-linearity of the circuit caused by a varying cutoff degree of the transistor Q2 can be substantially eliminated.

Figure 3:
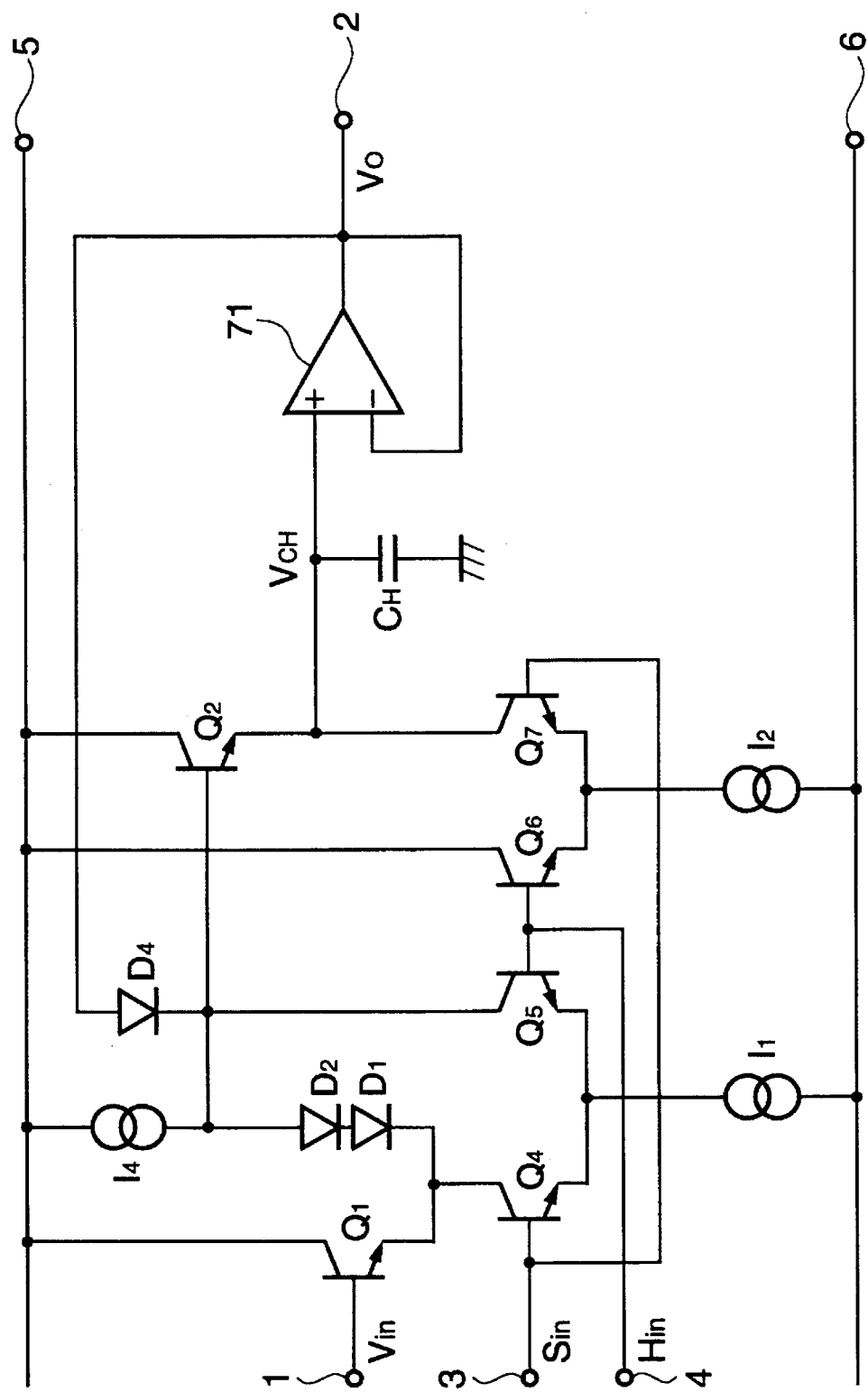
FIG. 3 is a circuit diagram of a second embodiment of the sample hold circuit in accordance with the present invention.

Referring to FIG. 3, there is shown a second embodiment of the sample hold circuit in accordance with the present invention. In FIG. 3, elements corresponding or similar to those shown in FIG. 2 are given the same Reference Numerals, and explanation thereof will be omitted.

As seen from comparison between FIGS. 2 and 3, the second embodiment is the same as the first embodiment, excepting that the buffer 7 of the first embodiment is replaced with an operation amplifier 71 having its non-inverting input connected to the hold capacitor $C_H$ and its output connected not only to the output terminal 2 and the anode of the diode D4, but also to an inverting input of the operational amplifier 71 itself so that a closed loop full feedback is constituted.

In this circuit construction, the analog input voltage Vin is not level-shifted by the voltage $V_{LS}$, and therefore, the base-emitter voltage $V_{BE2}$ of the transistor Q2 becomes $\{-V_D\}$. Accordingly, the base-emitter of the transistor Q2 is applied with a constant reverse-bias voltage of $\{V_D\}$. In this second embodiment, thus, the non-linearity of the circuit can be substantially eliminated, similarly to the first embodiment.

Figure 4:
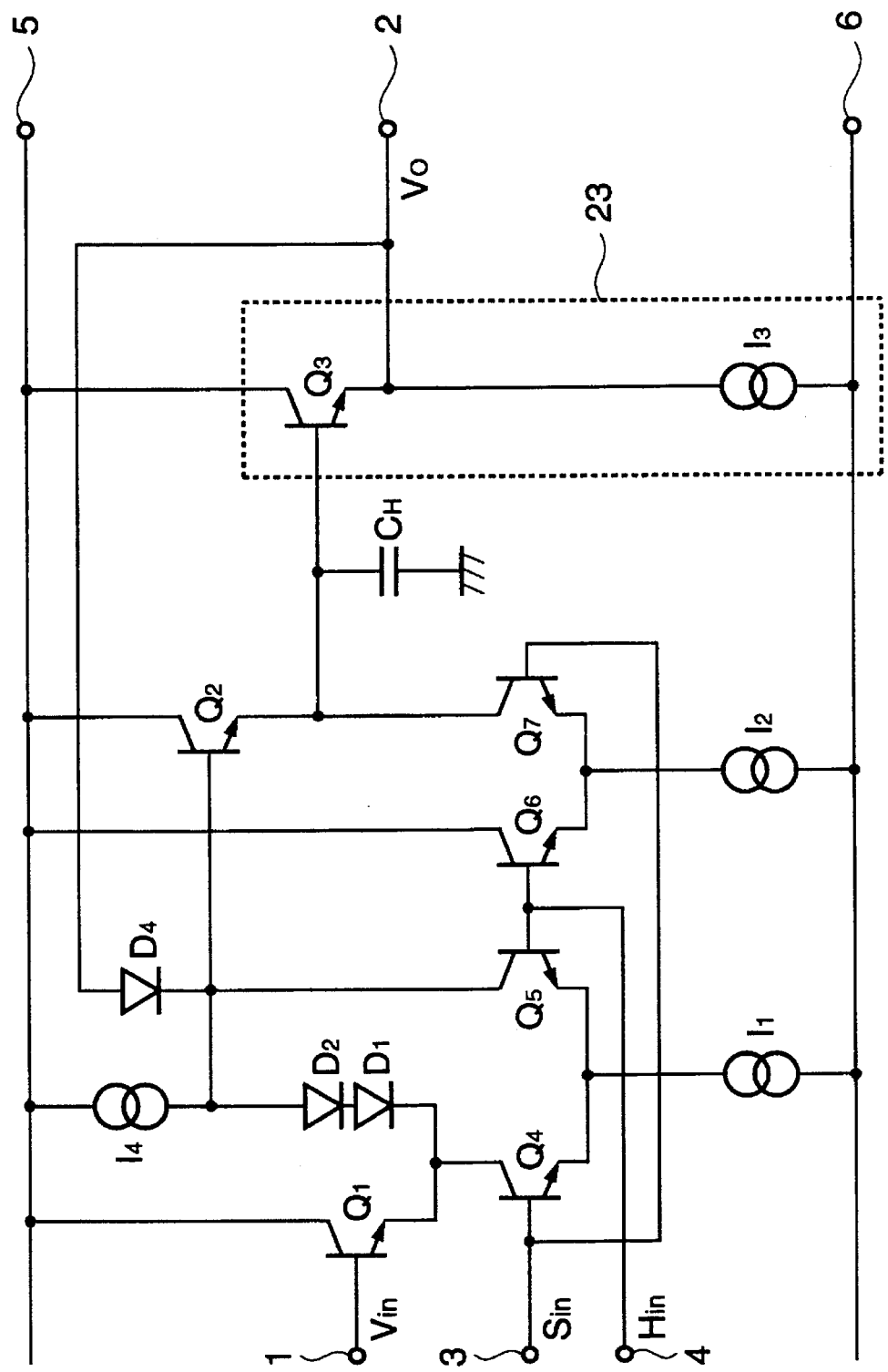
FIG. 4 is a circuit diagram of a third embodiment of the sample hold circuit in accordance with the present invention.

Referring to FIG. 4, there is shown a third embodiment of the sample hold circuit in accordance with the present invention. In FIG. 4, elements corresponding or similar to those shown in FIG. 2 are given the same Reference Numerals, and explanation thereof will be omitted.

As seen from comparison between FIGS. 2 and 4, the third embodiment is the same as the first embodiment, excepting that the buffer 7 of the first embodiment is replaced with an emitter follower 23 having a bipolar transistor Q3 having its base connected to the hold capacitor $C_H$, its collector connected to the high voltage supply terminal 5 and its emitter connected to the output terminal 2 and the anode of the diode D4, and a current source I3 having its one end of the emitter of the transistor Q3 and its other end connected to the low voltage supply terminal 6.

In this third embodiment, the level shift voltage $V_{LS}$ becomes a base-emitter voltage $V_{BE3}$ of the transistor Q3, and therefore, by equalizing the current densities of various elements similarly to the first embodiment, the following relation can be obtained:

$$V_{BE3} = V_D$$

If $V_{BE3} = V_D$, the base-emitter voltage $V_{BE2}$ of the transistor Q2 becomes $\{-2V_D\}$. Accordingly, the base-emitter of the transistor Q2 is applied with a constant reverse-bias voltage of $\{2V_D\}$. In this third embodiment, thus, the non-linearity of the circuit can be substantially eliminated, similarly to the first and second embodiments.

Figure 5:
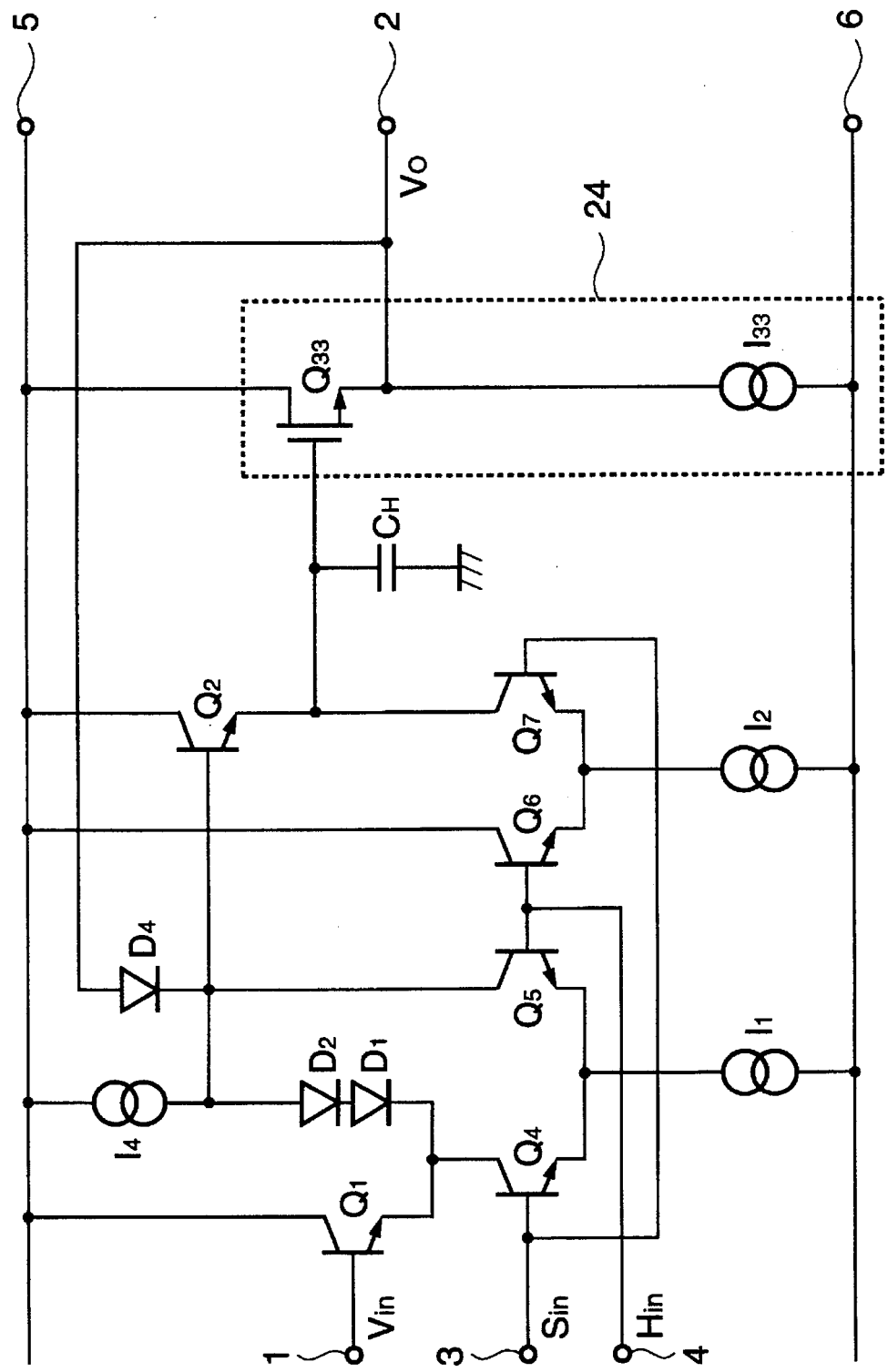
FIG. 5 is a circuit diagram of a fourth embodiment of the sample hold circuit in accordance with the present invention.

Referring to FIG. 5, there is shown a fourth embodiment of the sample hold circuit in accordance with the present invention. In FIG. 5, elements corresponding or similar to those shown in FIG. 2 are given the same Reference Numerals, and explanation thereof will be omitted.

As seen from comparison between FIGS. 2 and 5, the fourth embodiment is the same as the first embodiment, excepting that the buffer 7 of the first embodiment is replaced with a source follower 24 having a field effect transistor Q33 having its gate connected to the hold capacitor $C_H$, its drain connected to the high voltage supply terminal 5 and its source connected to the output terminal 2 and the anode of the diode D4, and a current source I33 having its one end connected to the source of the field effect transistor Q33 and its other end connected to the low voltage supply terminal 6.

In this fourth embodiment, the level shift voltage $V_{LS}$ becomes a gate-source voltage $V_{GS3}$ of the transistor Q3, and therefore, the base-emitter of the transistor Q2 is applied with a constant reverse-bias voltage of $\{V_{GS3}+V_D\}$. This would be readily understood from the explanation of the third embodiment.

Figure 6:
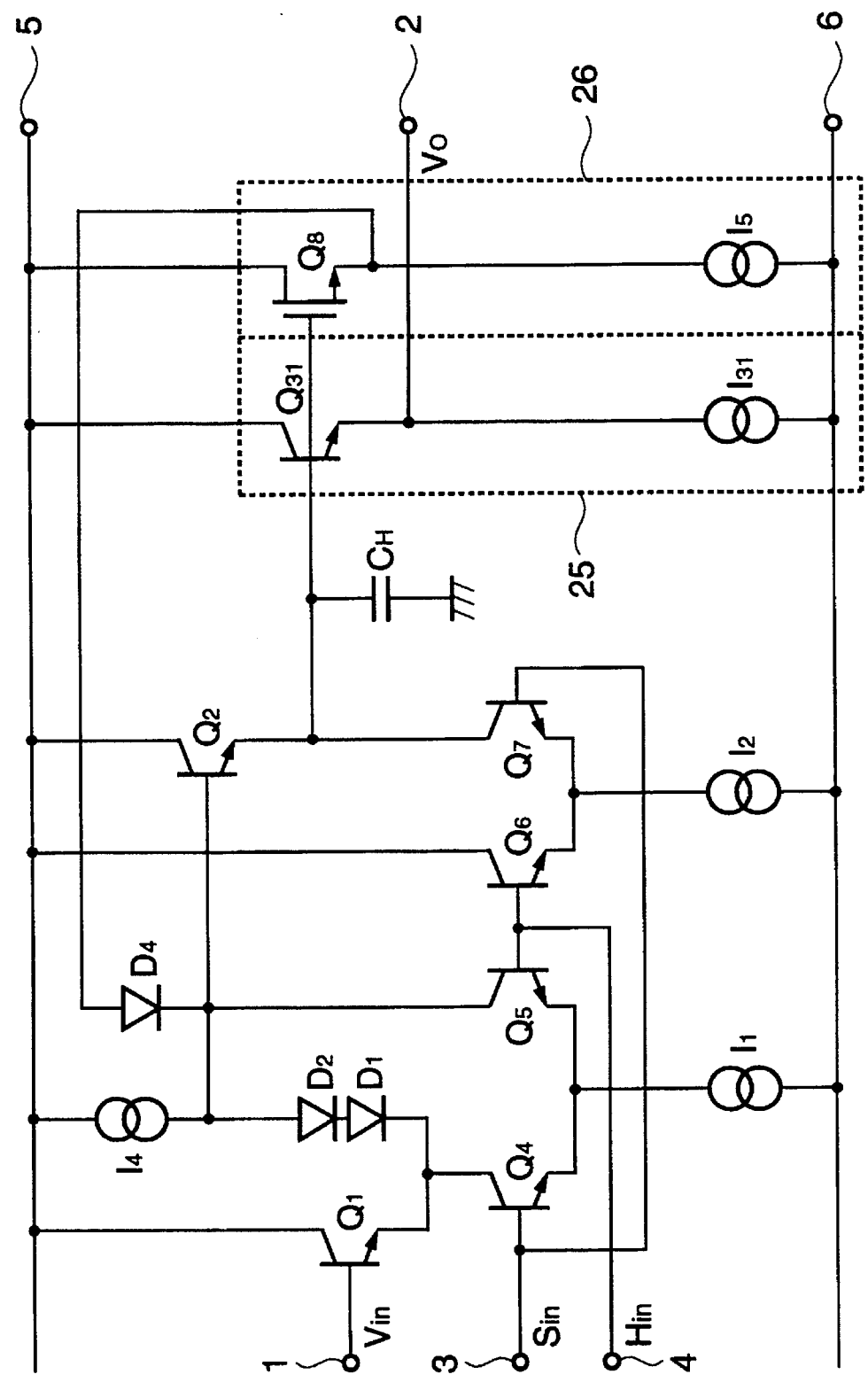
FIG. 6 is a circuit diagram of a fifth embodiment of the sample hold circuit in accordance with the present invention.

Referring to FIG. 6, there is shown a fifth embodiment of the sample hold circuit in accordance with the present invention. In FIG. 6, elements corresponding or similar to those shown in FIG. 2 are given the same Reference Numerals, and explanation thereof will be omitted.

As seen from comparison between FIGS. 2 and 6, the fifth embodiment is the same as the first embodiment, excepting that the buffer 7 of the first embodiment is replaced with an emitter follower 25 having a bipolar transistor Q31 having its base connected to the hold capacitor $C_H$, its collector connected to the high voltage supply terminal 5 and its emitter connected to the output terminal 2 and a current source I31 having its one end of the emitter of the transistor Q31 and its other end connected to the low voltage supply terminal 6, and a source follower 26 having a field effect transistor Q8 having its gate connected to the hold capacitor $C_H$, its drain connected to the high voltage supply terminal 5 and its source connected to the anode of the diode D4, and a current source I5 having its one end connected to the source of the field effect transistor Q8 and its other end connected to the low voltage supply terminal 6.

In this fifth embodiment, the base-emitter of the transistor Q2 is applied with a constant reverse-bias voltage of $\{V_{GS8}+V_D\}$, similarly to the fourth embodiment shown in FIG. 5.

In this fifth embodiment, on the other hand, since the output terminal 2 of the sample hold circuit is connected with the output of the emitter follower 25 and the anode of the diode D4 is connected with the output of the source follower 26, the output voltage Vo is not subjected to noise occurring when the transistor Q5 and the diode D4 are rendered conductive, in comparison with the third and fourth embodiments.

Figure 7:
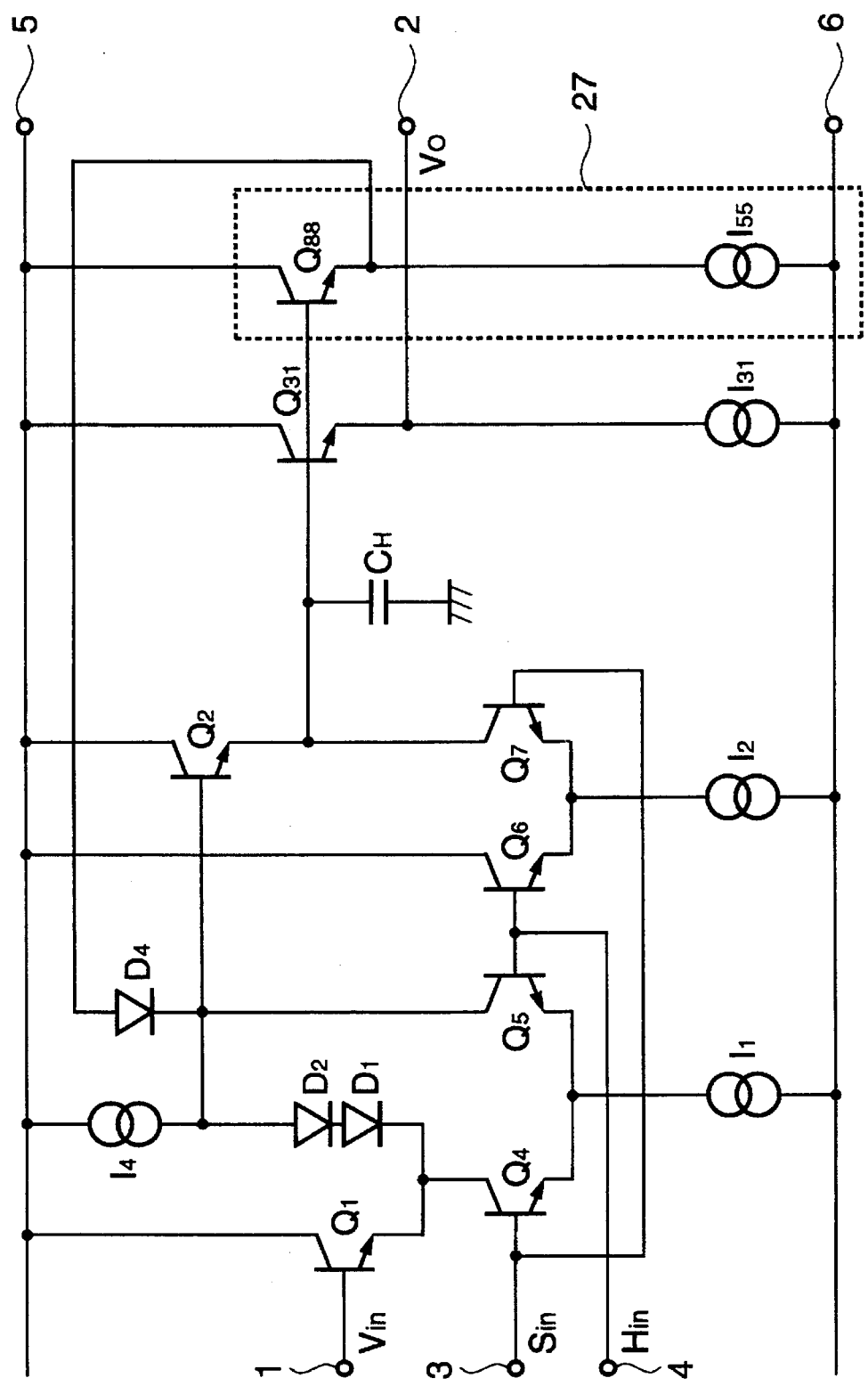
FIG. 7 is a circuit diagram of a sixth embodiment of the sample hold circuit in accordance with the present invention.

Referring to FIG. 7, there is shown a sixth embodiment of the sample hold circuit in accordance with the present invention. In FIG. 7, elements corresponding or similar to those shown in FIG. 6 are given the same Reference Numerals, and explanation thereof will be omitted.

As seen from comparison between FIGS. 6 and 7, the sixth embodiment is the same as the fifth embodiment, excepting that the source follower 26 of the fifth embodiment is replaced with an emitter follower 27 having a bipolar transistor Q88 having its base connected to the hold capacitor $C_H$, its collector connected to the high voltage supply terminal 5 and its emitter connected to the anode of the diode D4 and a current source I55 having its one end of the emitter of the transistor Q88 and its other end connected to the low voltage supply terminal 6.

In this sixth embodiment, the base-emitter of the transistor Q2 is applied with a constant reverse-bias voltage of $\{2V_D\}$, similarly to the third embodiment shown in FIG. 4. Accordingly, similarly to the fifth embodiment, it is possible to reduce the noise occurring when the transistor Q5 and the diode D4 are rendered conductive.

Figure 8:
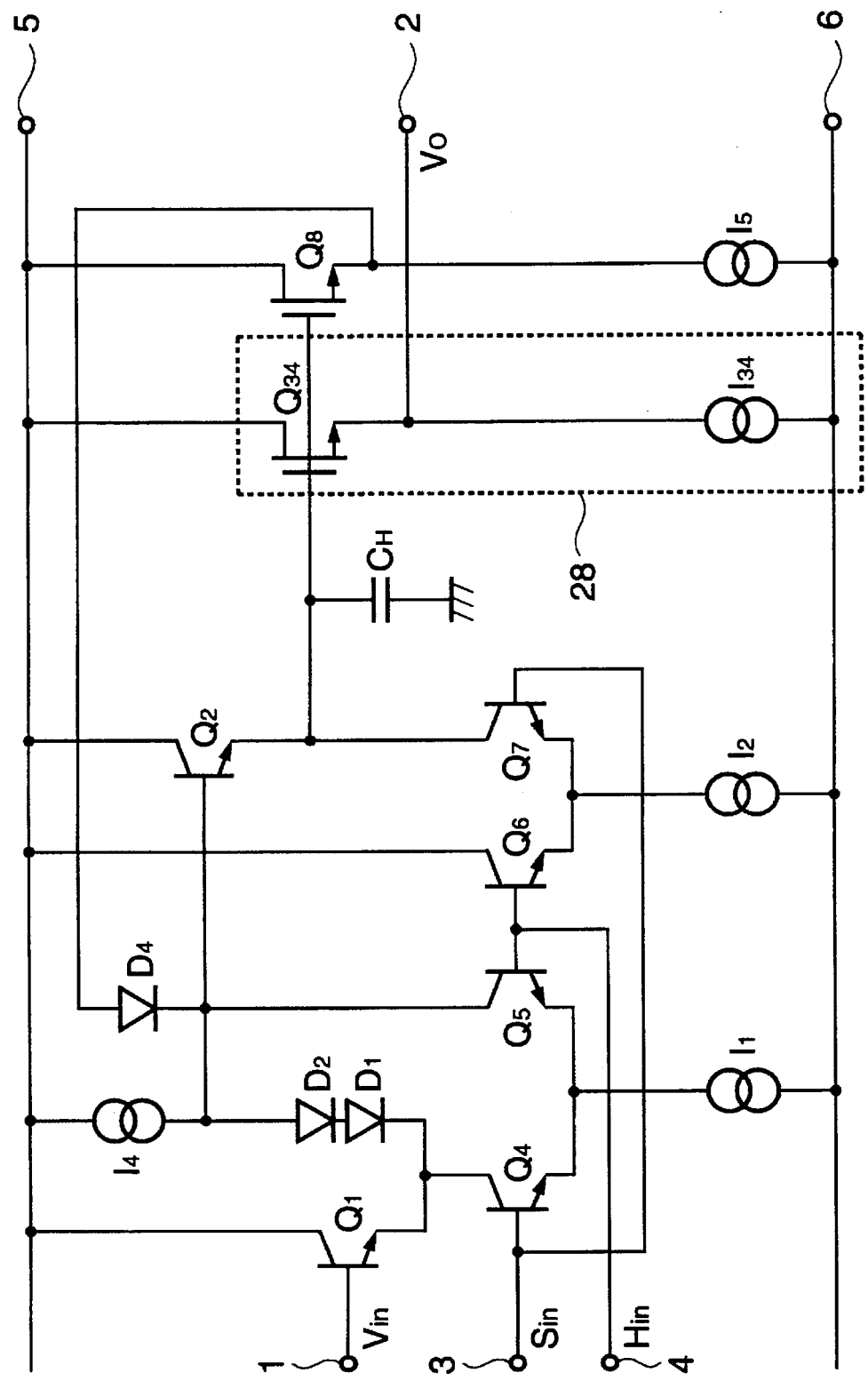
FIG. 8 is a circuit diagram of a seventh embodiment of the sample hold circuit in accordance with the present invention.

Referring to FIG. 8, there is shown a seventh embodiment of the sample hold circuit in accordance with the present invention. In FIG. 8, elements corresponding or similar to those shown in FIG. 6 are given the same Reference Numerals, and explanation thereof will be omitted.

As seen from comparison between FIGS. 6 and 8, the seventh embodiment is the same as the fifth embodiment, excepting that the emitter follower 25 of the fifth embodiment is replaced with a source follower 28 having a field effect transistor Q34 having its gate connected to the hold capacitor $C_H$, its drain connected to the high voltage supply terminal 5 and its source connected to the output terminal 2 and a current source I34 having its one end of the source of the field effect transistor Q34 and its other end connected to the low voltage supply terminal 6.

In this seventh embodiment, the base-emitter of the transistor Q2 is applied with a constant reverse-bias voltage of $\{V_{GS8}+V_D\}$, similarly to the fifth embodiment shown in FIG. 6. Accordingly, similarly to the fifth embodiment, it is possible to reduce the noise occurring when the transistor Q5 and the diode D4 are rendered conductive.

In the above mentioned third to seventh embodiments, the emitter follower and the source follower of the buffer in the sample hold circuit have been described to be of an N-channel input type. However, it would be apparent to persons skilled in the art that the emitter follower and the source follower can be of a P-channel input type or can be formed of a combination of an N-channel transistor and a P-channel transistor.

The invention has thus been shown and described with reference to the specific embodiments. However, it should be noted that the present invention is in no way limited to the details of the illustrated structures but changes and modifications may be made within the scope of the appended claims.

I claim:

1. A sample hold circuit comprising:
   a sampling switch circuit including,
      a first transistor having a base connected to an input terminal and a collector connected to a voltage supply terminal;
      a first diode circuit having a cathode side connected to an emitter of said first transistor;
      a first constant current source having one end connected to an anode side of said first diode circuit and an other end connected to said voltage supply terminal;
      a first differential circuit including a second transistor having a collector connected to the emitter of said first transistor and a base connected to a first control input to receive a sample mode signal, and a third transistor having a collector connected to said anode side of said first diode circuit and a base connected to a second control input to receive a hold mode signal complementary to said sample mode signal, and a second constant current source having one end connected in common to emitters of said second transistor and said third transistor of said first differential circuit;
   a second diode circuit having a cathode side connected to said anode side of said first diode circuit;
   a fourth transistor having a base connected to a connection node between said first diode circuit and said second diode circuit and a collector connected to said voltage supply terminal; and
   a second differential circuit including a fifth transistor having a collector connected to said voltage supply terminal and a base connected to said second control input and a sixth transistor having a collector connected to an emitter of said second transistor and a base connected to said first control input, and a third constant current source having one end connected in common to emitters of said fifth transistor and said sixth transistor of said second differential circuit;
   a hold capacitor having one end connected to said emitter of said fourth transistor; and
   a buffer having an input connected to said hold capacitor and an output connected to an output terminal and an anode side of said second diode circuit,
wherein said output of said buffer is fed back through said second diode circuit to said sampling switch circuit, and wherein when said hold mode signal is active, said fourth transistor is put in a cutoff condition with a constant cutoff voltage, thereby eliminating a non-linearity of the sample hold circuit.

2. The sample hold circuit as recited in claim 1, wherein said buffer includes an operational amplifier having a non-inverting input connected to said hold capacitor and an output connected to said output terminal and said anode side of said second diode circuit, said output of said operational amplifier being connected to an inverting input of said operational amplifier, thereby providing a closed loop full feedback.

3. The sample hold circuit as recited in claim 1, wherein said buffer comprises an emitter follower.

4. The sample hold circuit as recited in claim 1, wherein said buffer comprises a source follower.

5. A sample hold circuit comprising:
   a sampling switch circuit including,
      a first transistor having a base connected to an input terminal and a collector connected to a voltage supply terminal;
      a first diode circuit having a cathode side connected to an emitter of said first transistor;
      a first constant current source having one end connected to an anode side of said first diode circuit and an other end connected to said voltage supply terminal;
      a first differential circuit including a second transistor having a collector connected to the emitter of said first transistor and a base connected to a first control input to receive a sample mode signal, and a third transistor having a collector connected to said anode side of said first diode circuit and a base connected to a second control input to receive a hold mode signal complementary to said sample mode signal, and a second constant current source having one end connected in common to emitters of said second transistor and said third transistor of said first differential circuit;

a second diode circuit having a cathode side connected to said anode side of said first diode circuit;

a fourth transistor having a base connected to a connection node between said first diode circuit and said second diode circuit and a collector connected to said voltage supply terminal; and a second differential circuit including a fifth transistor having a collector connected to said voltage supply terminal and a base connected to said second control input, and a sixth transistor having a collector connected to an emitter of said fourth transistor and a base connected to said first control input, and a third constant current source having one end connected in common to emitters of said fifth transistor and said sixth transistor of said second differential circuit;

a hold capacitor having one end connected to said emitter of said fourth transistor; and a buffer having an input connected to said hold capacitor, a first output connected to an anode side of said second diode circuit, and a second output connected to an output terminal, wherein said first output of said buffer is fed back through said second diode circuit to said sampling switch circuit, and wherein when said hold mode signal is active, said fourth transistor is put in a cutoff condition with a constant cutoff voltage, thereby eliminating a non-linearity of the sample hold circuit.

6. The sample hold circuit as recited in claim 5, wherein said buffer includes an emitter follower and a source follower, an output of said source follower being connected to said anode side of said second diode circuit, an output of said emitter follower being connected to said output terminal.

7. The sample hold circuit as recited in claim 5, wherein said buffer includes two emitter followers, an output of one of said two emitter followers being connected to said anode side of said second diode circuit, an output of an other of said two emitter followers being connected to said output terminal.

8. The sample hold circuit as recited in claim 5, wherein said buffer includes two source followers, an output of one of said two source followers being connected to said anode side of said second diode circuit, an output of an other of said two source followers being connected to said output terminal.

9. A sample hold circuit comprising:
a sampling switch circuit including, a first transistor having a control electrode connected to an input terminal, one end of a current path of said first transistor being connected to a voltage supply terminal;

a first diode circuit having a cathode side connected to an other end of said current path of said first transistor;

a first constant current source having one end connected to an anode side of said first diode circuit and an other end connected to said voltage supply terminal;

a first differential circuit including a first input connected to a first control input to receive a sample mode signal and a second input connected to a second control input to receive a hold mode signal complementary to said sample mode signal, said first differential circuit also including a first branch connected to said other end of said first transistor and a second branch connected to said anode side of said first diode circuit;

a second diode circuit having a cathode side connected to said anode side of said first diode circuit;

a second transistor having a control electrode connected to a connection node between said first diode circuit and said second diode circuit, one end of a current path of said second transistor being connected to said voltage supply terminal; and a second differential circuit including a first input connected to said second control input and a second input connected to said first control input, said second differential circuit also including a first branch connected to said voltage supply terminal and a second branch connected to an other end of said current path of said second transistor;

a hold capacitor having one end connected to the other end of said current path of said second transistor; and a buffer having an input connected to said hold capacitor and an output connected to an output terminal and an anode side of said second diode circuit, wherein said output of said buffer is fed back through said second diode circuit to said sampling switch circuit, and wherein when said hold mode signal is active, said second transistor is put in a cutoff condition with a constant cutoff voltage, thereby eliminating a non-linearity of the sample hold circuit.

* * * * *